United States Patent
Young

(10) Patent No.: US 6,168,982 B1
(45) Date of Patent: Jan. 2, 2001

(54) MANUFACTURE OF ELECTRONIC DEVICES COMPRISING THIN-FILM CIRCUIT ELEMENTS

(75) Inventor: Nigel D. Young, Redhill (GB)

(73) Assignee: U.S. Philips Corporation, New York, NY (US)

( * ) Notice: Under 35 U.S.C. 154(b), the term of this patent shall be extended for 0 days.

(21) Appl. No.: 09/374,695

(22) Filed: Aug. 16, 1999

(30) Foreign Application Priority Data

Aug. 15, 1998 (GB) .................................................. 9817745

(51) Int. Cl.$^7$ .................................................. H01L 21/20
(52) U.S. Cl. ........................ 438/171; 438/172; 313/422; 445/30
(58) Field of Search .................................. 438/171, 172, 438/173, 174, 186, 187, 188; 313/422, 407, 408, 30; 445/37, 68, 25

(56) References Cited

U.S. PATENT DOCUMENTS

| | | | |
|---|---|---|---|
| 3,660,706 | * 5/1972 | Steinberg et al. | 313/64 |
| 4,259,612 | * 3/1981 | Christiano et al. | 313/422 |
| 4,605,879 | * 8/1986 | Rath | 313/407 |
| 4,644,222 | * 2/1987 | Brunn | 313/406 |
| 5,045,847 | * 9/1991 | Tarui | 340/783 |
| 5,053,353 | * 10/1991 | Black | 437/62 |
| 5,101,261 | * 3/1992 | Maeda | 357/68 |
| 5,102,813 | * 4/1992 | Kobayashi et al. | 437/40 |
| 5,114,871 | * 5/1992 | Jones | 437/41 |
| 5,130,829 | 7/1992 | Shannon | 359/59 |
| 5,147,823 | * 9/1992 | Ishibashi et al. | 437/225 |
| 5,238,861 | 8/1993 | Morin et al. | 437/51 |
| 5,264,383 | * 11/1993 | Young | 437/40 |
| 5,364,717 | * 11/1994 | Furaya et al. | 430/5 |
| 5,506,467 | * 4/1996 | Nishimura et al. | 313/408 |
| 5,634,837 | * 6/1997 | Nishimura et al. | 445/25 |
| 5,668,018 | 9/1997 | Cronin et al. | 430/5 |

FOREIGN PATENT DOCUMENTS

| | | | |
|---|---|---|---|
| 401124933 | * 5/1989 | (JP) | 211/13 |
| 405054793 | * 3/1993 | (JP) | 9/14 |

* cited by examiner

*Primary Examiner*—Charles Bowers
*Assistant Examiner*—Laura Schillinger
(74) *Attorney, Agent, or Firm*—John C. Fox

(57) ABSTRACT

The manufacture of AMLCDs and similar large-area electronic devices includes forming thin-film circuit elements (11, 12, 13, 14) on a substrate (10), with some of the process steps being self-aligned by shadow-masking. An upstanding post (20) is provided at a first area (10a) of the substrate (10) to one side of a second area (10b) where there is to be formed a thin-film circuit element (11), for example a TFT. First and second parts of the circuit element (11), for example, the TFT channel (3') and gate (5a'), are defined by respective first and second angled exposures with beams (61, 62) from the direction of the upstanding post (20) which acts as a shadow mask for part of the second area (10b). A plurality of the upstanding posts (20) may be at least partly retained in the manufactured device, for example, as supports on which a plate (30) is mounted so as to be spaced from the substrate (10). This configuration is particularly useful for the manufacture of AMLCDs and similar flat-panel displays, where the plate (30) and the substrate (10) may form front and back plates of the display device, with a display medium (40) in the spacing defined by the supports (20).

10 Claims, 4 Drawing Sheets

US 6,168,982 B1

MANUFACTURE OF ELECTRONIC DEVICES COMPRISING THIN-FILM CIRCUIT ELEMENTS

BACKGROUND OF THE INVENTION

This invention relates to methods of manufacturing an electronic device, for example, an active-matrix liquid-crystal display (hereinafter termed "AMLCD") which comprises thin-film circuit elements, wherein self-aligned process steps are used. The invention also relates to electronic devices comprising thin-film circuit elements with self-aligned features. Typically the circuit element may be a thin-film field-effect transistor (hereinafter termed "TFT"). Instead of an AMLCD, the device may be, for example, another type of flat panel display or other large-area electronic device with thin-film circuit elements, for example, a thin-film data store or an image sensor.

OBJECTS AND SUMMARY OF THE INVENTION

For many years now, there has been much interest in the manufacture of TFTs and other thin-film circuit elements on glass and on other inexpensive insulating substrates for large area electronics applications. Thus, TFTs fabricated with amorphous or polycrystalline semiconductor films may form the switching elements of a cell matrix, for example, in an AMLCD as described in U.S. Pat. No. 5,130,829 (Our ref: PHB33646). A recent use involves the use of self-aligned techniques to reduce the number of separately aligned masking steps in the manufacture and/or to reduce parasitic effects (for example, parasitic capacitance) in the circuit elements. U.S. Pat. No. 5,264,383 (Our ref: PHB33727) describes an early example of such a method, wherein first and second parts of a thin-film circuit element are self-aligned with each other by shadow-masking in an angled exposure step during the manufacture. In the U.S. Pat. No. 5,264,383 method it is the gate electrode of a TFT that is used as the shadow mask, firstly in a perpendicular exposure and then in an angled exposure, for defining the lateral extent of highly-doped source and drain electrodes and a low-doped drain field-relief region. The whole contents of U.S. Pat. No. 5,130,829 and U.S. Pat. No. 5,264,383 are hereby incorporated herein as reference material.

It is an aim of the present invention to provide an improved and versatile self-alignment technique which may be adapted, particularly but not exclusively, for the manufacture of AMLCDs and similar large-area electronic devices.

According to the present invention there is provided a method of manufacturing an electronic device comprising thin-film circuit elements, as set out in Claim 1. In this method, an upstanding post is provided at a first area of the substrate to one side of a second area where a thin-film circuit element is formed, and first and second parts of the circuit element are defined by respective first and second angled exposures from the direction of the upstanding post which acts as a shadow mask for part of the second area.

The nature of the upstanding post used in such a method in accordance with the invention is not constrained by it needing to form part of the circuit element. However, the post (or at least a part of it) can advantageously form part of the manufactured device. Thus, a plurality of the upstanding posts may be distributed over the substrate and may be at least partly retained in the manufactured device as supports on which a plate is mounted so as to be spaced from the substrate. This configuration is particularly useful for the manufacture of AMLCDs and similar flat-panel displays, where the plate and the substrate form front and back plates of the display device, with a display medium in the spacing defined by the supports.

BRIEF DESCRIPTION OF THE DRAWINGS

These and other features of the present invention, and their advantages, are illustrated specifically in embodiments of the invention now to be described, by way of example, with reference to the accompanying diagrammatic drawings, in which.

Figure 1A:
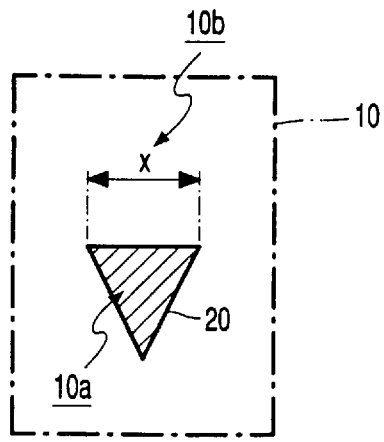
FIG. 1A is a plan view and FIG. 1B is a cross-sectional view of a device substrate with an upstanding post, at an early stage in the manufacture of an AMLCD by a method in accordance with the present invention, successive stages of which are illustrated sequentially in FIGS. 2 to 8.
Figure 1B:
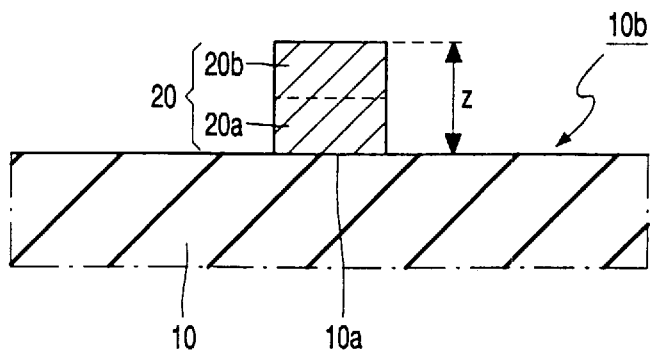

It should be noted that all the drawings are diagrammatic and not drawn to scale. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 8:
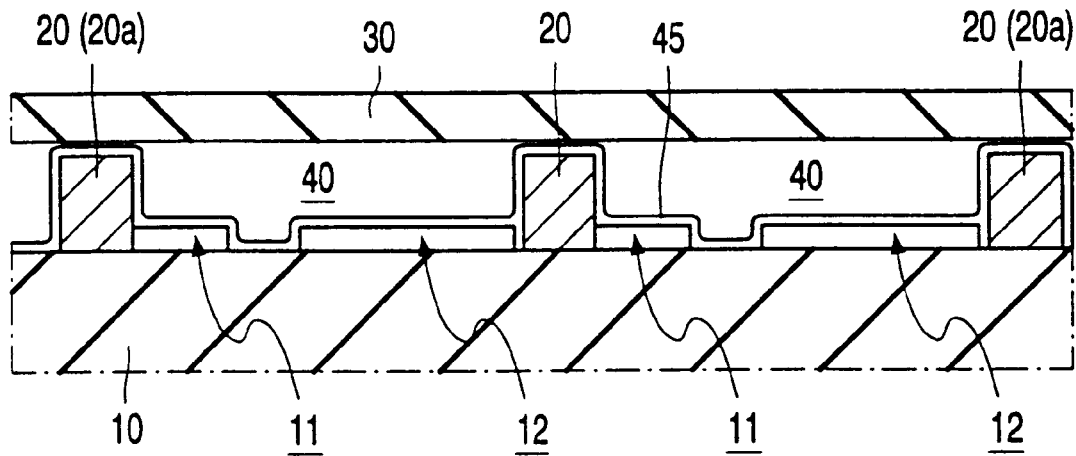
FIG. 8 is a cross-sectional view of a part of the AMLCD device manufactured using the method steps illustrated in FIGS. 1 to 7 and showing parts of two pixel areas and three upstanding posts.

In overview, FIGS. 1 to 8 illustrate the manufacture of a large-area electronic device in the form of an AMLCD, comprising thin-film circuit elements 11, 12, 13 and 14 which are formed on a substrate 10 by a method including the steps of:

provided a plurality of upstanding posts 20 distributed over the substrate 10, with each post 20 located at a first area 10a of the substrate to one side of a second area 10b where a circuit element 11 (in the form of a TFT) is to be formed (FIGS. 1A and 1B), defining first and second parts (in the form of the TFT channel 3' and gate 5a') of the circuit element 11 by respective first and second angled exposures (FIGS. 3 and 6) from the direction of the upstanding post 20 which acts as a shadow mask for part of the second area 10b of the substrate 10, and at least partly retaining the upstanding posts 20 in the manufactured device as supports on which a plate 30 is mounted so as to be spaced from the substrate 10 (FIG. 8).

In the embodiment of FIGS. 1 to 8, the post 20 is used for first and second angled exposures of photoresist layers 51 and 52. One layer 51 is a negative photoresist and the other layer 52 is a positive photoresist, so that these two angled exposures from the same direction form complementary first and second photoresist masks 51' and 58 for defining complementary patterns for the circuit element 11, in the form of the TFT source and drain electrode spacing and the TFT gate.

Figure 3:
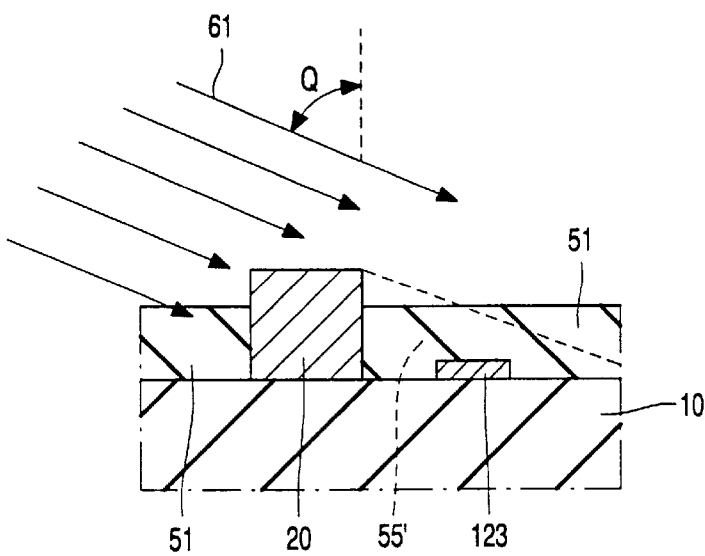
FIG. 3 is a cross-sectional view on the line III—III of a part of the device substrate of FIG. 2 at a successive stage, showing a first angled exposure.
Figure 5:
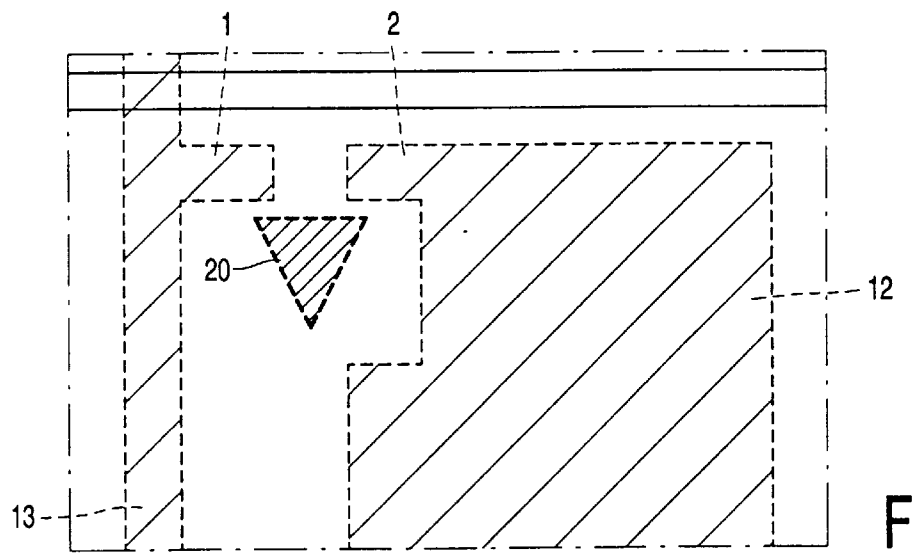
Figure 6:
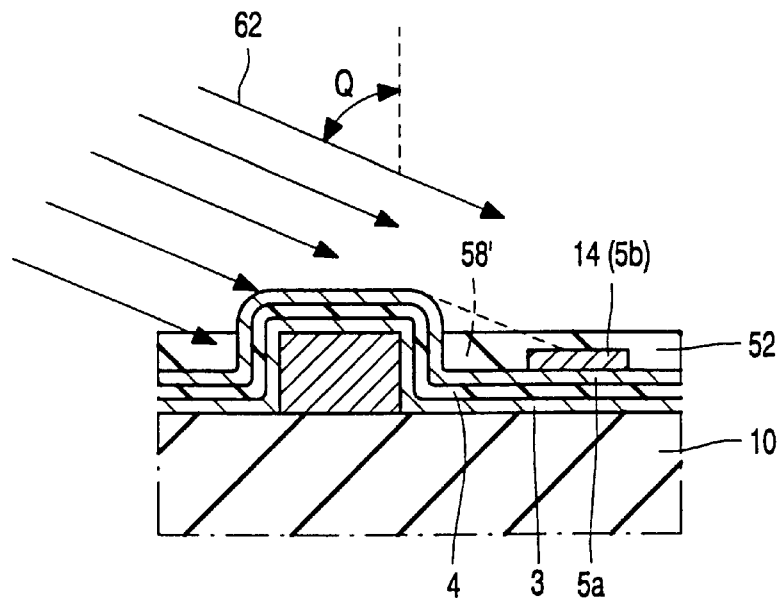
FIG. 6 is a cross-sectional view of the part of FIG. 3 at a subsequent stage, showing a second angled exposure.

Except for the use of the posts 20 of FIGS. 1 and 8 and the angled exposures of FIGS. 3 and 6, this AMLCD device can be manufactured using known technologies, for example as disclosed in U.S. Pat. No. 5,130,829. The thin-film circuit elements formed on the substrate 10 are a matrix of pixel electrodes 12, matrix-switching TFTs 11, column lines 13 and row lines 14. In the specific embodiment of the process steps to be described with reference to FIGS. 5 to 7, a so-called "2-mask alignment" top-gate TFT technology is used, by way of example, similar to that disclosed in U.S. Pat. No. 5,238,861, where this technology is used to form also thin-film storage capacitors for each pixel. The whole contents of U.S. Pat. No. 5,238,861 are hereby incorporated herein as reference material. When such a 2-mask alignment technology is used in addition to the self-alignment features in accordance with the present invention, the semiconductor film 3 and gate insulating film 4 of the TFT 11 are present not only in the area 10b of the TFT 11, but also under the row lines 14. However, it will be evident that other known TFT technologies may be used, for example as disclosed in U.S. Pat. No. 5,130,829, in which the semiconductor film 3 and gate insulating film 4 are restricted to the TFT area 10b.

The AMLCD device has the substrate 10 carrying the thin-film circuitry 11–14 for the side-by-side pixels and forming a back plate of the display. This device substrate 10 is electrically insulating at least adjacent to its top surface. The substrate 10 may comprise a glass or another low-cost insulator, for example a polymer material. In a particular embodiment, the substrate 10 may comprise an upper layer of silicon dioxide on a glass base. In each pixel area of the substrate 10, an upstanding post 20 is formed at the upper surface by depositing a masking material and shaping it using conventional photolithographic and etching techniques. Preferably reactive ion etching (RIE) or another anisotropic plasma or ion etching technique is used to give the post 20 substantially vertical walls. Thus, a matrix of upstanding posts 20 are formed on the substrate 10. A peripheral ring of upstanding posts (or an upstanding peripheral ring) may also be formed on the substrate 10 simultaneously with the posts 20, as the boundary of the liquid-crystal cell of the display.

A variety of masking materials may be used for the posts 20, depending on the nature of the exposures to be masked. In the present embodiment the photoresist exposures are effected with ultra-violet light, and so at least one material which is opaque to this ultra-violet light is used. The posts 20 may be formed from a single layer of, for example, an opaque polymer or a metal. Alternatively, the posts may comprise multiple layers, for example a layer 20b of a second material on a layer 20a of a first material. The first material may be, for example, an electrically insulating polymer material or other dielectric material, whereas the second material may be, for example, an opaque metal. In this case, the layer 20a of the post 20 may be retained in the manufactured device, whereas the layer 20b may be removed after its use in shadow masking.

FIG. 1A shows one of the resulting posts 20, with a triangular shape in plan view. As well as having good structural integrity, the triangular shape of this post 20 casts a well-defined shadow with an angled light beam 61,62, i.e. the shadow has well-defined edges and a width which is not critically dependent on the exact direction of the beam 61,62. However, it will be evident that other shapes, for example, rounded or rectangular, may be used for the cross-section of the post 20. The width x of the post is related in this embodiment to the desired channel length of a matrix-switching TFT 11 and may be, for example, in the range of 1 $\mu$m to 10 $\mu$m. The height z of the post 20 is related to the spacing between the plates 10 and 30, where the liquid-crystal display material 40 is located. This spacing may be in the range of 4 $\mu$m (micrometres) to 6 $\mu$m in a typical example.

The height z of the post 20 also affects the angle $\theta$ (from the perpendicular) at which the exposures of FIGS. 3 and 6 are carried out in order to shadow mask the area 10b. In order to operate with readily manageable angles $\theta$, this height z is preferably at least three (and preferably more) times the height of the TFTs 11 on the substrate 10. Typically the height of the TFTs 11 above the substrate 10 is about 1.5 $\mu$m or less. The width of the thin-film circuit element 11 (associated, in this embodiment, with the width of the link 123 of FIG. 2) may be, for example, about 20 $\mu$m and be spaced by, for example, about 5 $\mu$m from the post 20. With these dimensions, the angle $\theta$ is about 80° if the height z of the post 20 is in the range of 4 $\mu$m to 6 $\mu$m. However, a much larger height z is readily useable when the post comprises two or more layers 20a and 20b and when only the bottom layer 20a is retained as the spacer between the plates 10 and 30. Thus, the total height z of a composite post 20 (20a,20b) may be, for example, about 10 $\mu$m or more. This permits the use of smaller angles $\theta$ for the exposures.

Figure 2:
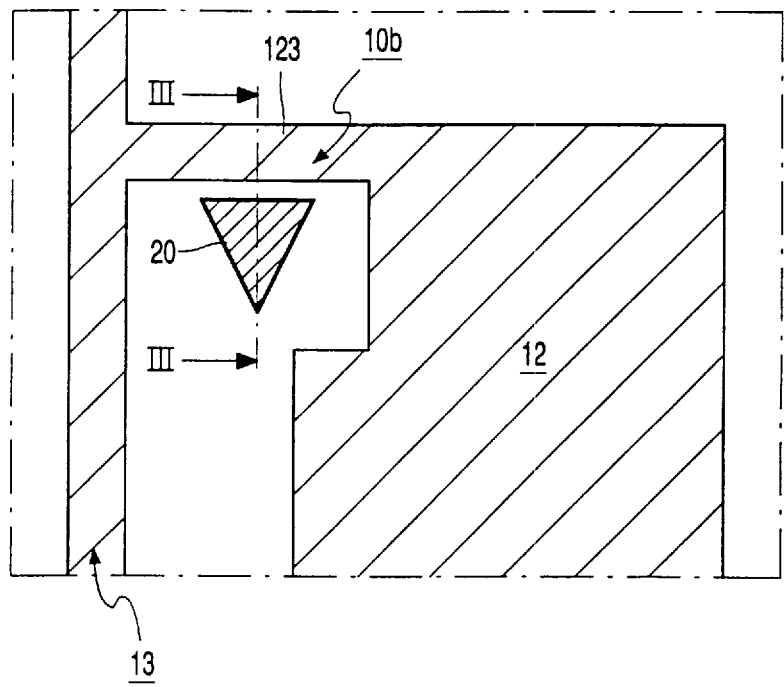
FIG. 2 is a plan view of a part of a pixel area of the device substrate of FIG. 1 at a successive stage in the manufacture.

A thin film of electrode material, for example ITO (indium tin oxide), is deposited in this embodiment as the first stage in the fabrication of the thin-film circuit elements. This film is patterned using conventional photolithographic and etching techniques to provide the pixel electrode 12 and column line 13, but with the unusual feature of an integral link 123 in the resulting pattern, at the area 10b between the electrode 12 and line 13. This resulting pattern is illustrated in FIG. 2. Typically the thickness of the film forming the pattern 12, 13, 123 is, for example, 0.5 $\mu$m or less.

Figure 4:
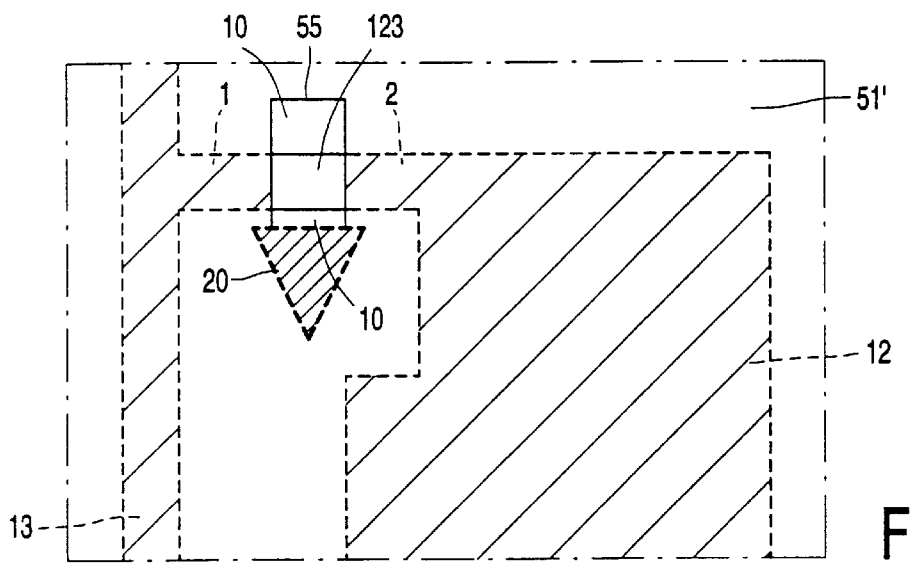
FIGS. 4 and 5 are plan views of the part of the device substrate of FIG. 2 at subsequent successive stages in the manufacture.

A first photoresist layer 51 of a negative photoresist is now deposited over the electrode film pattern 12, 13, 123, and the first shallow angled exposure is carried out with an ultraviolet light beam 61 as illustrated in FIG. 3. The post 20 casts a shadow, so masking the part 55' of the photoresist layer 51 on the substrate area 10b. By developing this shadow-masked part 55' in known manner, a window 55 is formed in the photoresist layer 51 exposing the link 123 as shown in FIG. 4. The window 55 formed in this way defines a spacing to be etched in the film pattern 12, 13, 123 between the pixel electrode 12 and conductor line 13. Thus, the remaining photoresist layer 51' serves in known manner as an etchant mask, while etching away the link 123 at the window 55. Source and drain electrodes 1 and 2 of the TFT 11 are defined in this way in this embodiment, being present at facing ends of the pixel electrode 12 and conductor line 13.

The etchant mask 51' is then removed, after which the electrode pattern 1, 2, 12, 13 may be exposed to a dopant source (for example phosphine) for adsorbing a dopant which is to be diffused into a subsequently-deposited silicon semiconductor film 3. There is then deposited a succession of thin-films 3, 4 and 5, namely a film 3 of semiconductor material (for the TFT channel), a film 4 of gate-dielectric material, and a film 5 of gate-electrode material. In the present embodiment which uses the 2-mask alignment technology, two films 5*a* and 5*b* of selectively-etchable materials (for example, chromium and aluminium) are successively deposited on the gate-dielectric film 4. The top film 5*b* is separately patterned using known photolithographic and etching techniques to form the row line 14. The resulting structure is illustrated in FIG. 5, with the continuous films 3, 4, and 5*a* covering the post 20 and the electrode pattern 1, 2, 12, 13, (including the area of the source and drain electrodes 1 and 2 and the spacing therebetween). Typically the respective thicknesses of the films 3, 4, 5*a*, and 5*b* are about 40 nm (nanometres), 400 nm, 50 nm and 500 nm.

Figure 7:
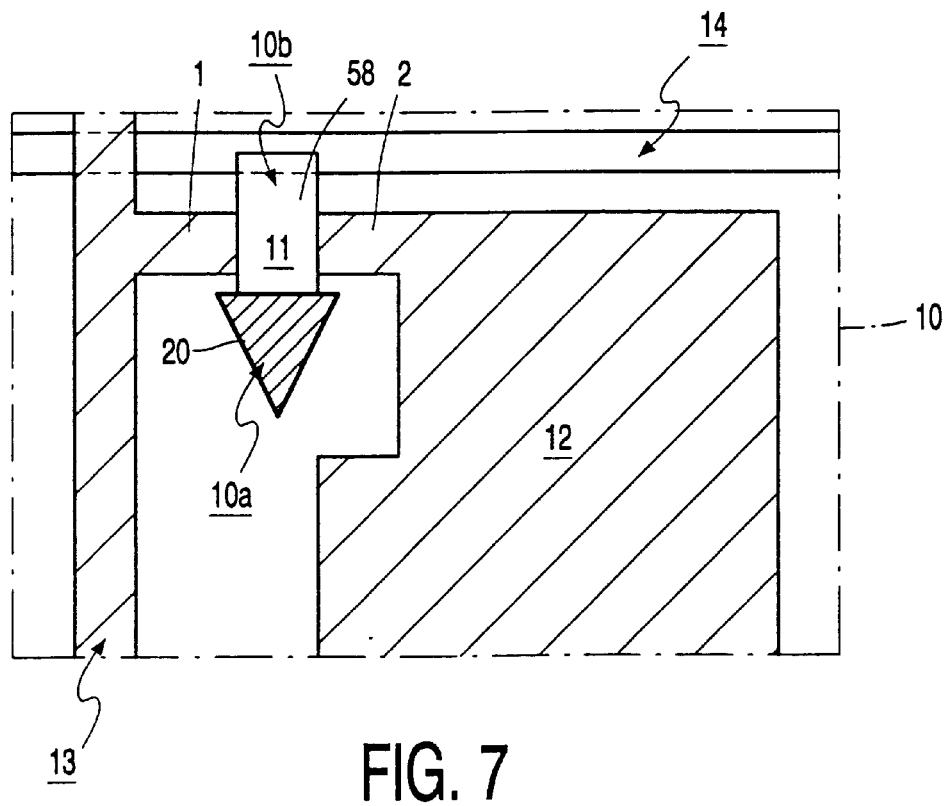
FIG. 7 is a plan view of the part of the device substrate of FIGS. 4 and 5 at a subsequent stage, after the completion of a TFT in this pixel area.

Photoresist layer 52 of a positive photoresist is then deposited, and the second angled exposure (FIG. 6) is performed with an ultraviolet light beam 62. In this case, the post 20 shadow-masks a part 58' of the photoresist layer 52 which remains over the area 10*b* when the exposed photoresist is developed. Thus, upon developing the exposed photoresist, an etchant mask 58 is formed over this area 10*b*. The chromium gate-electrode material 5*a* is then etched using the photoresist mask 58 and the aluminium row line 14 as an etchant mask, and etching is also continued downward through the exposed areas of the films 4 and 3. The resulting structure is illustrated in FIG. 7.

In this resulting structure of FIG. 7, the films 3, 4, and 5*a* remain only in the area below the aluminium row line 14 and in the area 10*b* below the photoresist mask 58. The films 3, 4, and 5*a* in the area 10*b* bridge the spacing between the source and drain electrodes 1 and 2 and so form the silicon channel 3', gate-dielectric 4' and gate electrode 5*a'* of the TFT 11 with the source and drain electrodes 1 and 2 in this area 10*b*. It is the spacing of the source and drain electrodes 1 and 2 that defines the location of the TFT 11 in these films 3, 4, and 5*a*. It may be noted that the films 3, 4, and 5*a* extend also between the TFT 11 and the post 20, when a 2-mask alignment technology is used. However, the films 3, 4 and 5*a* between the TFT 11 and the post 20 do not provide active TFT parts in this intermediate area because of the separation of the source and drain electrodes 1 and 2 from the post 20.

After removing the photoresist mask 58 in known manner, a thin protective coating 45 (for example, of silicon nitride) may be deposited over the thin-film circuit elements 11, 12, 13 and 14 and the upstanding posts 20, before mounting the plate 30 and adding the display material 40. However, it is not generally desirable to have a dielectric film over the pixel electrodes 12 (if low voltage operation is desired). Thus, the coating 45 may be omitted. When the posts 20 (and a peripheral ring) comprise first and second layers 20*a* and 20*b*, the second layer 20*b* may be removed by etching, before mounting the plate 30. In this case, the desired spacing (between the plates 10 and 30) is defined by the height of layer 20*a* of the posts. A sealant is provided around the periphery to seal the AMLCD panel in known manner, after the display material 40 is provided in the space between the plates 10 and 30.

It will be evident that many variations and modifications are possible within the scope of the present invention, using posts 20 to shadow-mask angled exposures for self-alignment of features of thin-film circuit elements 11. In the embodiment illustrated, the circuit element 11 was a top-gate TFT, having its source and drain electrodes 1 and 2 defined in the first angled exposure and its gate electrode 5*a* defined in the second angled exposure. However, the circuit element may be, for example, a bottom-gate TFT having its gate electrode 5*a''* defined from a bottom metallization film in a first angled exposure and its source and drain electrodes 1' and 2' defined from an upper-level metallisation film in a second angled exposure.

Figure 9:
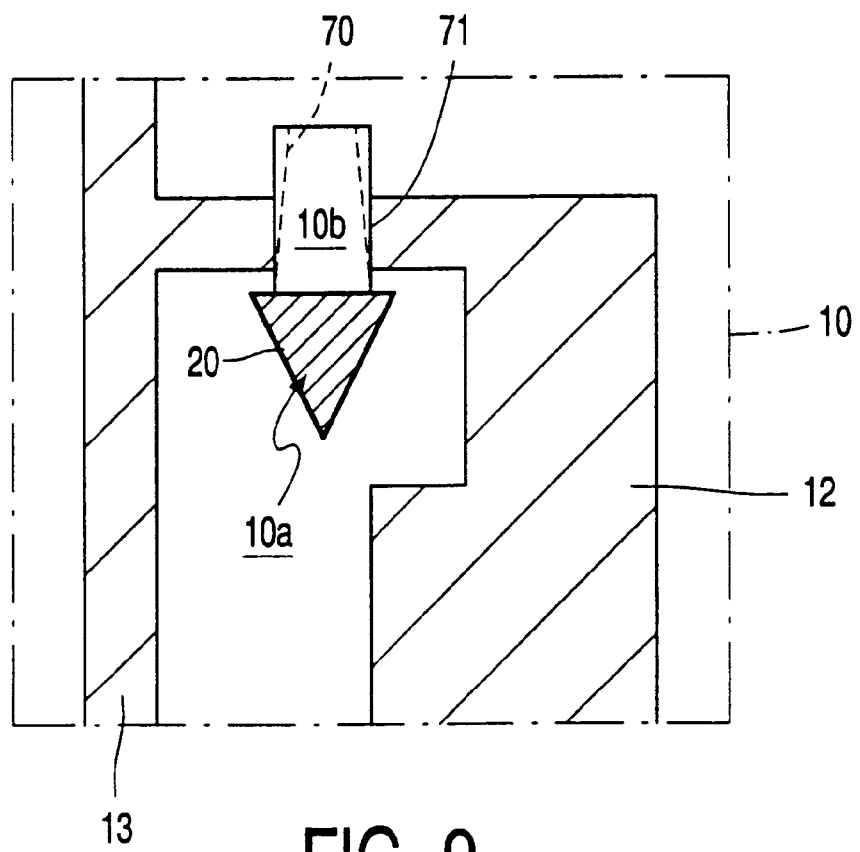
FIG. 9 is a plan view similar to part of FIGS. 4 and 7, but illustrating the use of a less collimated exposure beam in a modified method also in accordance with the present invention.

FIGS. 4 and 7 illustrate the effects of angled exposures with well-collimated beams 61 and 62. In this case, the second photoresist mask 58 can be the exact complement of the first photoresist mask 51', and the gate electrode pattern may be etched from the film 5*a* so as to bridge exactly the spacing between the source and drain electrodes 1 and 2. It is possible to achieve a degree of control for a slight overlap between the gate electrode 5*a'* and the source and drain electrodes 1 and 2, by controlling the extent of development of each photoresist and controlling any lateral extent of etching of the gate electrode pattern 5*a'* and the source and drain electrodes 1 and 2. FIG. 9 illustrates a modification in which a larger overlap (or an offset in the case of a drain field-relief region) can be achieved. In this FIG. 9 situation, one of the first and second angled exposures 61 and 62 is less collimated than the other so as to shadow-mask with the upstanding post 20 a narrower width 70 of the second area 10*b*, than the width 71 shadow-masked in the situations of FIGS. 4 and 7.

The drawings illustrate an upstanding post 20 being used as a shadow mask for part of a second area 10*b* of the substrate 10 to form a thin-film circuit element 11 at that second area 10*b*. It will be evident that the same upstanding post 20 may additionally be used as a shadow mask for part of a third area 10*c* of the substrate 10, using a third angled exposure, but from a direction different to that of the first and second angled exposures. Thus, this third area 10*c* is located to one side of the upstanding post 20, but in a different direction from the second area 10*b*. This third angled exposure may therefore be used in the formation of a thin-film circuit element 11' at this third area 10*c*.

In the embodiments so far described, the angled exposures were with light beams (generally ultraviolet light) for exposing photoresist layers. Etchant mask patterns 51' and 58 were then formed from the photoresist layers. However photoresist mask patterns defined in this way using the posts 20 may be used as dopant masks, instead of (or in addition to) being used as etchant masks. Thus, for example, such a photoresist pattern can mask against a dopant ion implantation. Furthermore, the posts 20 may be used to shadow-mask against exposures other than with light beams. Thus, for example, one or more of the angled beams may be a beam of ions which may be used to expose an ion-sensitive "photoresist" material, or it may even be a beam of dopant ions which are shadow-masked by the posts 20 in their implantation directly into a thin-film structure on the substrate 10.

From reading the present disclosure, other variations and modifications will be apparent to persons skilled in the art. Such variations and modifications may involve equivalent and other features which are already known in the design, manufacture and use of AMLCDs and other electronic devices comprising thin-film circuits and component parts thereof and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. Although the dependency of subsidiary Claims has been limited in the interests of meeting the requirements and reducing the fees for multiple-Claim-dependency in some countries, it should be understood that technical features included in any one Claim may be used in combination with technical features of any one of the other Claims. Particularly, but not exclusively, the following combinations are potentially important: features of claim 5 may be used in combination with any one of claims 2 to 4; features of claims 6, 7, 9 and 10 may be used in combination with any one of the Claims dependent on Claim 1.

The Applicants hereby give notice that new claims may be formulated to any such features and/or combinations of such features during the prosecution of the present application or of any further application derived therefrom.

What is claimed is:

1. A method of manufacturing an electronic device comprising thin-film circuit elements formed on a substrate, wherein first and second parts of a thin-film circuit element are self-aligned with each other by shadow-masking in an angled exposure step during the manufacture, characterised in that an upstanding post is provided at a first area of, and separate from, the substrate to one side of a second area where the circuit element is formed, and in that the first and second parts are defined by respective first and second angled exposures from the direction of the upstanding post which acts as a shadow mask for part of the second area.

2. A method as claimed in claim 1, further characterised in that there is provided a plurality of the upstanding posts distributed over the substrate, and the upstanding posts are retained in the manufactured device as supports on which a plate is mounted so as to be spaced from the substrate.

3. A method as claimed in claim 2, further characterised in that the upstanding posts which act as shadow masks comprise a layer of a second material on a layer of a first material, and in that the second material is removed before using the first material as the supports on which the plate is mounted.

4. A method as claimed in claim 3, further characterised in that the first material is an electrically insulating polymer, and the second material is a metal.

5. A method as claimed in claim 2, further characterised in that the manufactured device comprises a liquid-crystal display, in which a liquid crystal material is provided between the plate and the substrate.

6. A method as claimed in claim 1, further characterised in that the first and second angled exposures are of respective first and second photoresist layers, of which one is a negative photoresist and the other is a positive photoresist so as to form complementary first and second photoresist masks for defining complementary patterns for the first and second parts of the circuit element.

7. A method as claimed in claim 1, further characterised in that the circuit element is a thin-film transistor having source and drain electrodes defined in one of the first and second angled exposures and a gate electrode defined in the other of the first and second angled exposures.

8. A method as claimed in claim 7, further characterised in that the first and second angled exposures are of respective first and second photoresist layers to provide respective first and second etchant masks of photoresist, the first photoresist layer is of a negative photoresist and is deposited over a film of electrode material on the substrate to provide the first etchant mask having a window which defines a spacing to be etched in the film between source and drain electrodes, the first etchant mask is removed after etching the spacing, and thin-films of semiconductor material and of gate-dielectric material and of gate-electrode material are then deposited over the source and drain electrodes and the spacing, after which the second photoresist layer is deposited of a positive photoresist, and the second angled exposure is performed to provide the second etchant mask over the area of the gate-electrode material that is to be retained as the gate electrode.

9. A method as claimed in claim 1, further characterised in that one of the first and second angled exposures is less collimated than the other so as to shadow mask with the upstanding post a narrower width of the second area.

10. A method as claimed in claim 1, further characterised in that the height of the upstanding post above the substrate is at least three times the height of the circuit element above the substrate.

* * * * *